United States Patent [19]

Pasch et al.

[11] Patent Number: 5,532,516

[45] Date of Patent: Jul. 2, 1996

[54] TECHNIQUES FOR VIA FORMATION AND FILLING

[75] Inventors: Nicholas F. Pasch, Pacifica; Roger Patrick, Santa Clara, both of Calif.

[73] Assignee: LSI Logic Corportion, Milpitas, Calif.

[21] Appl. No.: 411,496

[22] Filed: Mar. 28, 1995

Related U.S. Application Data

[63] Continuation of Ser. No. 750,832, Aug. 26, 1991, Pat. No. 5,471,091.

[51] Int. Cl.$^6$ .................................................. H01L 23/48
[52] U.S. Cl. .......................... 257/752; 257/758; 257/774; 257/775
[58] Field of Search .................................... 257/774, 775, 257/752, 758

[56] References Cited

U.S. PATENT DOCUMENTS 5,287,002   2/1994   Freeman, Jr. et al. ................... 257/752

*Primary Examiner*—Rolf Hille
*Assistant Examiner*—Roy Potter
*Attorney, Agent, or Firm*—Katz & Cotton

[57] ABSTRACT

Via filling is enhanced by the techniques of 1) providing pillars immediately underneath semiconductor features, such as metal layer contacts (inter-connection points), and 2) polishing off excess via-filling material so that the via-filling plug is flush with the topmost insulating layer. The pillars are provided under every feature over which a via will be formed, so that an insulating layer surrounding the via will be thinner at the location of the feature. If necessary, polishing is continued to thin the insulating layer so that the plugs in initially selectively under-filled vias are made flush with the insulating layer. Method and apparatus are disclosed.

4 Claims, 3 Drawing Sheets

TECHNIQUES FOR VIA FORMATION AND FILLING

This is a continuation of application Ser. No. 07/750,832, filed Aug. 26, 1991 now U.S. Pat. No. 5,471,091.

TECHNICAL FIELD OF THE INVENTION

The present invention relates to the fabrication of semiconductor devices, or structures, and more particularly to the creation and filling of vias for multi-level metal structures.

BACKGROUND OF THE INVENTION

Obtaining adequate metal filling of via structures, when the thrust towards higher performance circuits demands thicker and thicker inter-metal dielectric coating with inevitably deeper vias, is approaching impossibility. The acceptance of poor metal step coverage into vias is no longer credible with customers, who demand better long term reliability.

Complex via-filling technologies, such as "blanket tungsten" or "self-aligned tungsten" are still in their infancy, with numerous problems in both the areas of equipment and process.

The use of conventional via formation techniques, with either sputtered or evaporated metalization, does not provide good via sidewall step coverage. CVD technology is promising, but is difficult to implement. The present invention is better, because it provides an improvement in metal step coverage, similar to that of CVD, but without introducing difficult process steps.

As is known, it is often desirable to smooth, or planarize, the top surface of a device at various stages in the fabrication of the semiconductor structure.

Commonly-owned U.S. Pat. No. 4,708,770 ("'770 patent"), entitled PLANARIZED PROCESS FOR FORMING VIAS IN SILICON WAFERS, issued Nov. 24, 1987 to Nicholas F. Pasch, discloses the use of dielectric pillars in selective areas of a device to enhance the planarization of said areas. More particularly, the patent is directed to the situation where a field oxide region is inherently higher than the adjacent diffusion region. A pillar is formed from a dielectric material overlying the diffusion area, such that the top surface of the dielectric material at the diffusion region is substantially at the same level as the top surface of the etched dielectric at the field oxide region. By this method, the distances or depths for etching vias (to an overlying metallization layer through a subsequent planarized dielectric layer) from the top surface of the structure to the metallization layer at the field oxide region and at the diffusion region are substantially the same (see column 1, lines 44–56). This is significant, because it allows vias to otherwise (without the pillar) deeper structures (metal over diffusion area) to be shallower, and shallower vias generally exhibit improved sidewall coverage of (overlying) metallization layer.

In the '770 patent, the possibility that the dielectric pillars could be used at all via locations on a given circuit, in order to enhance the step coverage of the subsequently formed via structure, is not disclosed. Rather, it is newly-disclosed in the present application.

It is noted, that in the abstract of the '770 patent, the pillar is located above the diffusion region "preferably", and that in the specification of the patent there is reference to vias at "one" location and "another" location (see column 3, lines 31–35), and that in claim 1 "first" and "second" via locations are referred to. However, the remaining disclosure of the '770 patent is specifically directed to the formation of pillars above the lower diffusion region to substantially equalize the height to of subsequent metal above the pillar and above the field oxide region. Notably, as pointed out in claim 1 of the '770 patent, there is a layer of dielectric material (from which the pillar was formed) remaining over the field oxide and diffusion regions.

Commonly-owned U.S. Pat. No. 4,879,257 ("'257 Patent"), entitled PLANARIZATION PROCESS, issued to Roger Patrick on Nov. 7, 1989, discloses a method for forming a multilayer integrated circuit device wherein the resultant top surface thereof is substantially planar. As in the '770 patent, the problem being addressed in the '257 patent is problems in via formation resulting from the offset (increased) height of a field oxide region versus a diffusion region. Two solutions are proposed in the '257 patent. In a first embodiment, shown in FIGS. 1A–1E, a first level of metallization is deposited and etched to form runners 18 and 20. The runner 18 is above the diffusion region 16, and the runner 20 is above the higher field oxide region. A first, conformal layer 22 of dielectric is deposited over the runners. A second, conformal layer 24 of dielectric is then deposited over the first dielectric layer 22. Vias ("cavities") 26 are then formed for connecting a subsequent layer of metal 34 to the runners 18 and 20. Prior to the deposition of metal layer 34, the vias are (selectively) filled with metal plugs 28, and the entire structure is coated with a planar layer of photoresist 30. The photoresist 30, dielectric layer 24 and metal plugs 28 are then uniformly etched back, resulting in a planar surface 32 for subsequent deposition of a subsequent metal layer 34. In a second embodiment, shown in FIGS. 2A–2E, a blanket (non-selective), generally conformal layer of metal 36 is applied, which fills the vias 26 and overlays the second dielectric layer 24. A planar layer of photoresist 38 is then applied over the metal 36. The photoresist 38, second dielectric layer 24 and metal layer 36 are then uniformly etched back, resulting in a planar surface for subsequent deposition of a subsequent metal layer 34. In both embodiments, the resulting vias have different aspect ratios.

The '257 patent relies on chemical etching processes to achieve planarity, which necessitates 1) first depositing a planar, sacrificial layer (e.g., of photoresist), and 2) careful control over the chemistry with regard to the various materials sought to be uniformly etched back. In contrast thereto, in the present invention a chemical/mechanical process is used to polish back the conductor and dielectric layers to a completely planarized surface, and it is not necessary to begin with a planar (sacrificial) layer.

Disclosure of the Invention

It is therefore an object of the present invention to provide a technique for creating via structures which relieves the problems of poor metal step coverage into via structures for multi-level metal structures.

It is a further object of the present invention to provide a via structure which is more amenable to subsequent sidewall step coverage.

It is a further object of the present invention to provide a technique for achieving significant improvements in metal step coverage, without requiring difficult process steps.

It is a further object of the present invention to provide a technique for filling overcoming the problem of "nail head" formation when selectively filling vias.

It is a further object of the present invention to provide a technique for simplifying the design process of devices having raised vias (pillars underlying metal), without compromising or modifying processes to accommodate both "regular" and "raised" vias.

According to the invention, dielectric pillar structures are created at the position of every subsequent via (i.e., the vias through overlying metal). The pillars underlie the bottom-most metal in the via stack, "pushing up" the metal layer at all via locations, so as to form ultimately shallower vias with improved sidewall step coverage. In this manner, all vias are essentially shallower than the insulating layer overlying the metal layer. Evidently, the insulating layer is thinnest where metal layers will be interconnected by vias, and thickest in remaining areas which serve an important insulating function. The technique of this invention can be applied to push up any layers, such as subsequent metal layers, as well as a first metal layer.

Further according to the invention, vias are formed to different structures at different levels of a semiconductor device. Some of these vias are substantially deeper than others. For example, vias extending to two different metal layers will be of dissimilar depth.

According to an aspect of the invention, "nail heads" resulting from overfilling shallower vias (e.g., by selectively filling the vias) are at least partially removed by polishing, such as chemi-mechanical polishing. Polishing is continued until a satisfactorily planar surface has been achieved on the insulating layer wherein the vias are formed.

According to an aspect of the invention, blanket via overfills having an irregular top surface topography are polished back, such as by chemi-mechanical polishing, until the vias are filled and the overlying metal is completely removed. All of the films, including the dielectric (insulating layer) can be polished flat at one time to give an overall flat surface.

Further according to the invention, the problem of filling vias extending to different levels of a semiconductor device is alleviated by 1) forming pillar structures pushing up metal layers below vias, and 2) by polishing off excess via-filling metal, whether nail heads resulting from selective via-filling or from overlying blanket (non-selective) metal deposition.

The aforementioned '770 patent discloses the use of dielectric pillars in selective areas of the device to enhance the planarization of said areas. The possibility that the dielectric pillars could be used at all via locations on a given circuit, in order to enhance the step coverage of the subsequently formed via structure, is not disclosed in the patent - rather, it is newly-disclosed in the present application. The techniques disclosed in the patent are applicable to the practice of the present invention. However, the teachings of the patent are significantly enhanced and expanded by the realization (as disclosed herein) that improvement in the step coverage over the entire structure can be much more valuable than the improvement in planarization over diffusion areas (as discussed in the patent).

Poor metal sidewall step coverage is significantly improved with this technique, without adding difficult-to-accomplish technologies.

Since all of the vias are raised, and of similar structure, the design process does not have to account for both raised and regular (not raised) vias. No compromise on design rules is necessary, and the CAD problem of dealing with both regular and raised vias is simplified. Likewise, since all of the vias are of similar structure, no modification or compromise of via etch processes to accommodate both regular and raised vias is necessary.

Other objects, features and advantages of the invention will become apparent in light of the following description thereof.

The present invention, in its various embodiments, benefits from the quantitative and qualitative understandings of polishing as described in the aforementioned patent, entitled TRENCH PLANARIZATION TECHNIQUES and filed on Jun. 6, 1991 by Schoenborn and Pasch.

When polishing is referred to herein, it should be understood that it can be purely abrasive polishing (lapping), as described (e.g.) in U.S. Pat. No. 4,940,507, but is preferably chemi-mechanical polishing as described (e.g.) in U.S. Pat. Nos. 4,671,851, 4,910,155 and 4,944,836, all of which patents are incorporated by reference herein.

DETAILED DESCRIPTION OF THE INVENTION

PUSHED-UP METAL UNDERLYING VIAS

Figure 1:
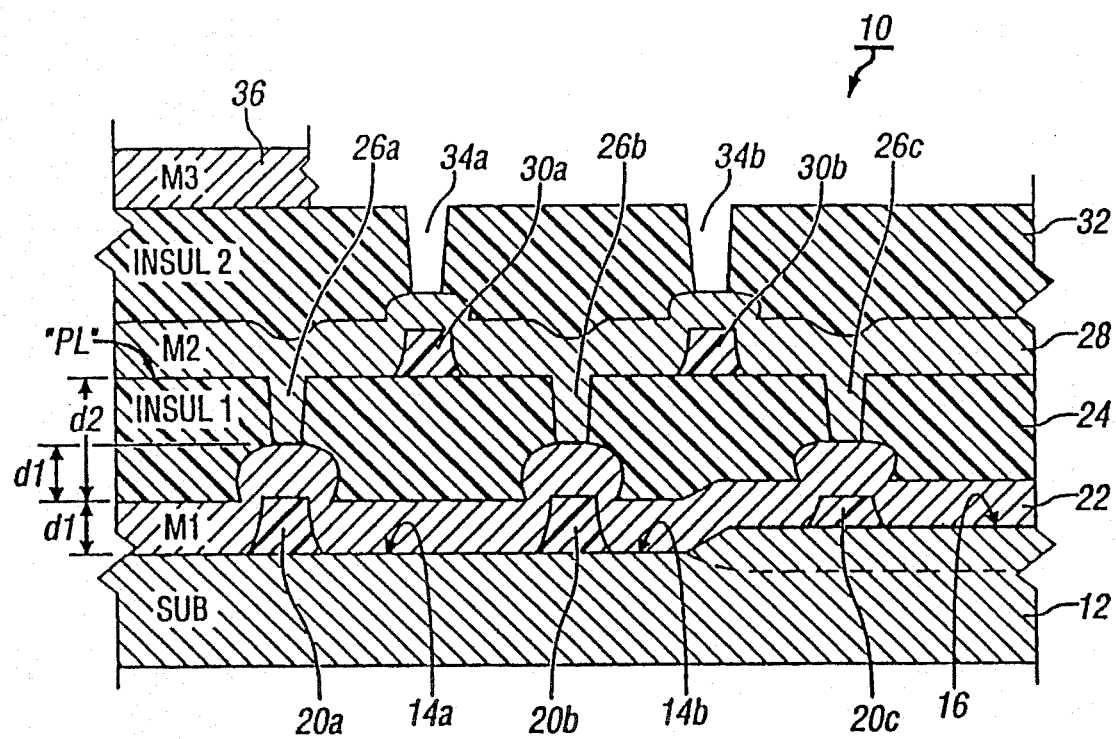
FIG. 1 is a simplified cross-sectional view of a portion of a semiconductor device, such as an integrated circuit, having pillars constructed in various areas to push up overlying metal in the locations of vias, so of that vias formed through a subsequent dielectric layer are shallower. A multi-level metallization device is illustrated.

FIG. 1 shows a portion of a semiconductor device 10. A substrate 12 has a generally planar top surface topography, including top surface areas 14a and 14b at wafer level and other top surface areas 16 that are somewhat elevated. By way of example, the area 16 could be a field oxide region, and the area 14b could be a diffusion area. However, it is important that the present invention is applicable to any and all areas above which vias are to be formed. Various insulating, stress relief and adhesion layers, and the like, which may be formed directly on the substrate 12 are omitted for descriptive clarity.

Pillars 20a, 20b and 20c are formed at via locations. As described in the '770 patent, the pillars are formed of a dielectric material, and the techniques described therein are entirely applicable to the formation of the pillars 20a, 20b and 20c. In this example, pillars 20a and 20b are formed over wafer-level areas 14a and 14b, and the pillar 20c is formed over the elevated area 16.

If the pillars are formed by applying and etching a dielectric layer (not shown), they will be of uniform thickness (t) and non-uniform height. Preferably, the pillars are planarized, so that their tops are all at the same height, in which case the higher elevated pillars (e.g., 20c) will be thinner (t'; t'<t). Various known techniques for planarizing are suited to this procedure, among which are applying a sacrificial planar layer, or layers, such as flowable photoresist over the pillars, and uniformly etching back the sacrificial layer until the tops of all the pillars are exposed. Of course, the tops of the highest pillars (e.g., 20c) will have been etched back in this process. In FIG. 1, the higher elevated pillar 20c is thinner than the lower elevated pillars 20a and 20b, but the tops of all of the pillars are at equal heights above wafer level.

A conformal first metal (M1) layer 22 is applied over the substrate. The thickness of the M1 layer is generally uniform over the pillars 20a, 20b, 20c and over the various areas 14a, 14b, 16 of the substrate. The thickness of the M1 layer is designated "d1". The M1 layer exhibits "mushroom cap" cross section over the pillars, and a step at the step up to the higher elevated substrate area 16. The thickness d1 of the M1 layer is preferably no greater than the thickness t of the pillars.

An insulating layer 24 ("Insul 1") is applied over the M1 layer, and is of any suitable insulating material, such as silicon dioxide, glass, and the like, applied by any suitable process, such as Chemical Vapor Deposition (CVD). Typically, the insulating layer 24 would be conformal to the topography of the M1 layer - meaning that it would have a similar irregular top surface topography. Preferably, the insulating layer 24 is planarized, and it is illustrated as already having been planarized in FIG. 1. Note the legend "PL". There are a number of suitable planarization techniques which could be employed. One such technique is discussed in the '770 patent. Abrasive or chemical/mechanical polishing techniques could also be employed.

The resulting thickness, d2, of the insulating layer 24 must of course be greater than the thickness, d1, of the M1 layer. It will be noted that it is substantially thinner in the areas above the M1 mushroom caps, where subsequent vias will be formed, and is thicker (d2) in the remaining areas. The ultimate application of the techniques of this invention will dictate how thick the insulating layer 24 must be over the M1 mushroom caps. In any case, the insulating layer is substantially thicker in the remaining areas, where vias and interconnects will not be formed.

Vias 26a, 26b and 26c are formed through the insulating layer 24, using any of a number of known techniques (e.g., masking and etching), for inter-connecting an overlying metal layer "M2" 28 to the M1 layer 22. However, prior to metal deposition, pillars 30a and 30b are formed atop the insulating layer 24. In the preferred case that the insulating layer 24 has already been planarized, these pillars 30a and 30b between the M1 and M2 layers serve only to reduce the thickness of an overlying insulating layer (INSUL 2) 32 between the M2 layer and a subsequent M3 layer 36 (shown partially). More particularly, the pillars 30a and 30b push up the overlying M2 layer 28 at the location of subsequently to-be-formed vias 34a and 34b. As in the case of the insulating layer 24 between M1 and M2, the insulating layer 32 between M2 and M3 will be relatively thin at the location of subsequent metal-filled via interconnects, and relatively thicker at all other locations (where inter-metal insulation is most pertinent).

If the insulating layer 24 is not to be planarized, the pillars 30a and 30b can conveniently be formed integrally with the insulating layer 24.

A subsequent second metal (M2) layer 28 is deposited over the insulating layer 24, covering same and filling the vias 26a, 26b and 26c for interconnecting to the pushed up areas of the first metal layer 22. Again, the pillars 30a and 30b push up the metal in locations where vias are to be formed to subsequent metal layers, and the like. Evidently, it is preferable that the pillars 30a and 30b pushing up the second metal layer 28 be offset from the pillars 20a, 20b and 20c pushing up the first metal layer 22.

Another insulating layer 32 is deposited over the second metal layer 28. Again, the insulating layer 32 is thinner where vias 34a and 34b are to be formed to an overlying third metal (M3) layer 36, and thicker at areas where interconnects to the M3 layer are not to be made.

This process of pushing up metal layers at all locations where vias are to be formed for subsequent inter-connection to a next subsequent metal layer can continue through the course of many metal layers.

Evidently, by locating pillars under metal at every via location, whether with respect to a single layer of metal or multi-level metallization, an insulating layer overlying the metal layer is relatively thinner at locations (vias) where connections to the pushed-up metal layer are to be made. This ensures better via sidewall coverage, and represents a remarkable, non-intuitive advance over the teachings of the '770 patent.

VIA FILLING

Figure 2A:
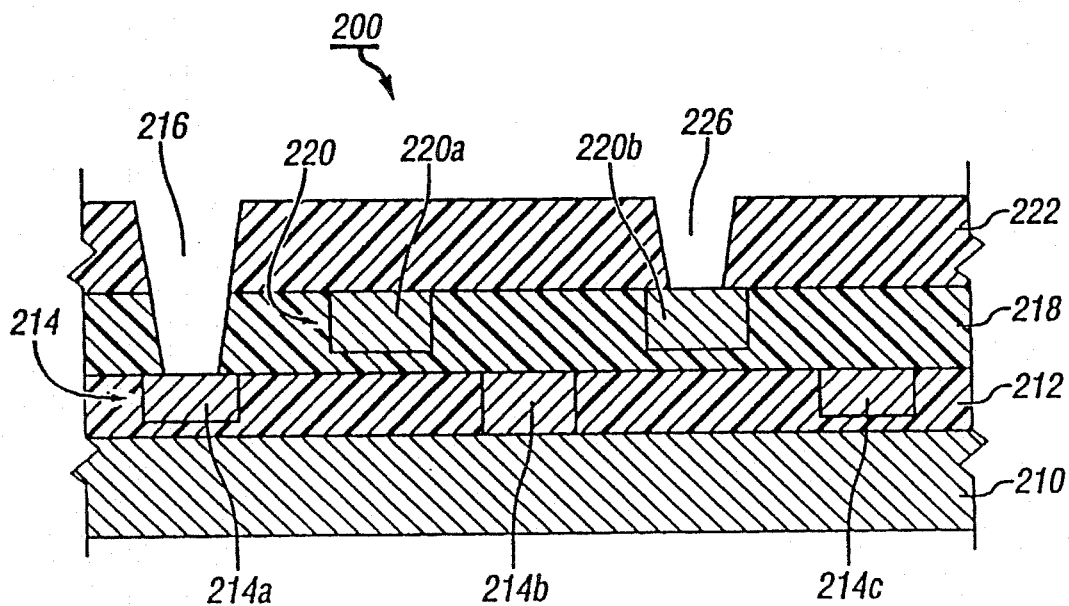
FIG. 2A is a cross-section of a semiconductor device showing vias extending to different layers of the device.

FIG. 2A shows a semiconductor device 200 having a substrate 210 and an insulating layer 212 overlying the substrate. Various insulating, stress relief and adhesion layers, and the like, are omitted for descriptive clarity.

A first structure-containing layer 214, containing structures 214a, 214b and 214c is formed in the insulating layer 212, by any known technique. These structures can be metal "runners", comprising a first level (M1) of metallization, or other structures. The structures can extend only partially into the insulating layer, as shown by the structures 214a and 214c, or can extend through the insulating layer 212 to the substrate 210, as shown by the structure 214b. The first structure-containing layer 214 could alternately be entirely atop the insulating layer 212.

As shown in FIG. 2A, a via 216 will be subsequently formed to permit inter-connecting to the structure 214a in the first structure-containing layer 214.

Another layer 218, such as an insulating layer, is formed atop the first structure-containing layer 214.

A second structure-containing layer 220 is formed in (as shown) or on (not shown) the second insulating layer 218. Again, the structure-containing layer 220 contains structures 220a and 220b, such as metal runners in a second level of metallization.

Another layer 222, such as an insulating layer, is formed atop the second structure-containing layer 220. A via 226 is formed through the layer 222 for inter-connecting to one of the structures 220b.

Hence, it is readily seen that vias 216 and 226, both extend through the second insulating layer 222. However, whereas the via 226 extends only through this layer 222 to a structure 220b in the second structure-containing layer 220, the via 216 extends further, through the first insulating layer 218 to a structure 214a in the first structure-containing layer 214.

For the reasons mentioned hereinbefore, it is difficult to fill vias having different depths, or aspect ratios (same opening size, different depths).

Figure 2B:
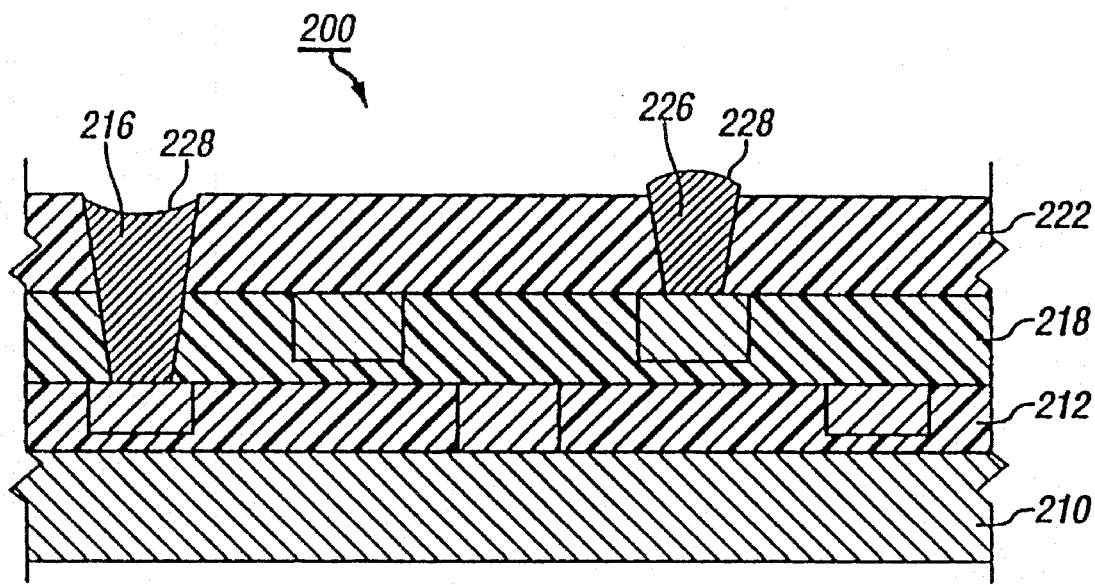
FIG. 2B is a cross-section of the semiconductor device of FIG. 2A, showing the vias selectively filled, and exhibiting excess via-filling metal in the form of a "nail head".

FIG. 2B shows a technique for selectively filling the vias 216 and 226. This technique is suitably described in the aforementioned U.S. Pat. No. 4,879,257. As is evident, in using a selective filling technique, there may result inadequate filling of the metal 228 filling the deeper via 216, and excess metal 228 over-filling the shallower via 226. The excess metal 228 over-filling the via 226 is referred to as a "nail head" because of its resemblance thereto.

Figure 2C:
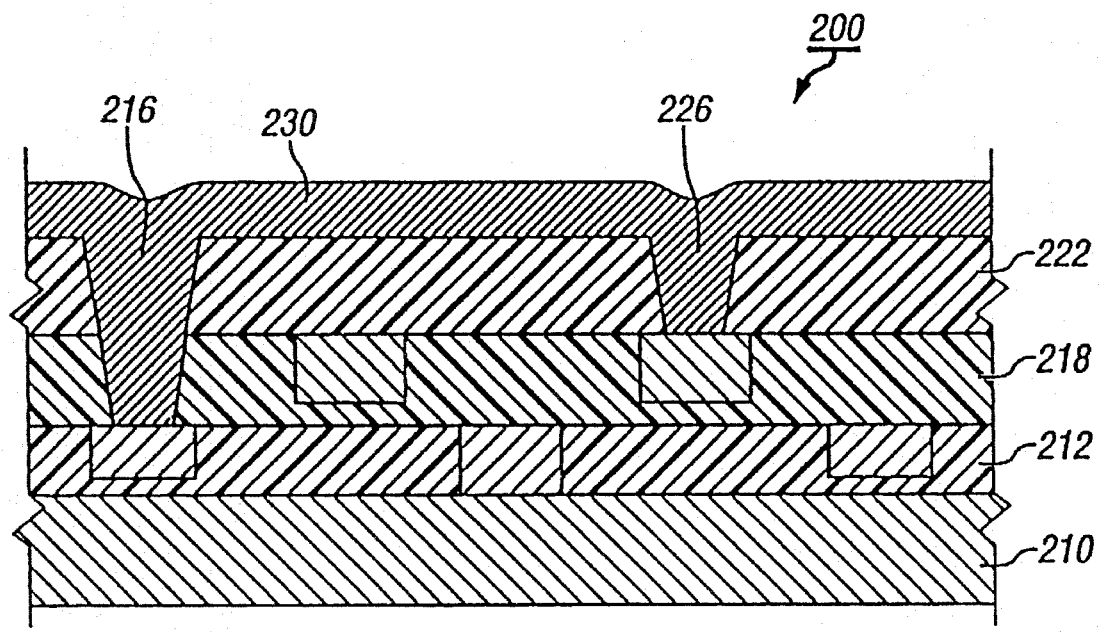
FIG. 2C is a cross-section of the semiconductor device of FIG. 2A, showing the vias filled by blanket deposition of subsequent metal, wherein the excess via-filling metal (not in the vias) needs to be removed.

FIG. 2C shows a technique for non-selectively filling the vias 216 and 226. This technique is suitably described in the aforementioned U.S. Pat. No. 4,879,257. As is evident, using a non-selective filling technique, there will result in excess metal 230 over-filling the vias and blanket-covering the remaining portion (top surface) of the second insulating layer 222.

In either case, i.e. selective filling (FIG. 2B) or non-selective filling (FIG. 2C), excess metal must be removed. As described in the aforementioned U.S. Pat. No. 4,879,257, this can be accomplished by using a sacrificial layer (e.g., photoresist) and uniformly etching back the sacrificial layer and the excess metal. In the case of an under-filled via (e.g., the via 216 in FIG. 2B), etching can continue thinning the second insulating layer 222 until the metal plugs (228, 230) filling the vias are flush with the top surface of the insulating layer 222.

However, as mentioned hereinbefore, etching can be a difficult to control process, especially where a uniform (substantially equal rate) etch of dissimilar materials is concerned.

Hence, in the present invention, excess metal over-filling vias is removed through abrasive (mechanical) or chemi-mechanical (chemical/mechanical) polishing. The use of chemi-mechanical polishing is relatively new, and lends itself appropriately to this situation.

Figure 2D:
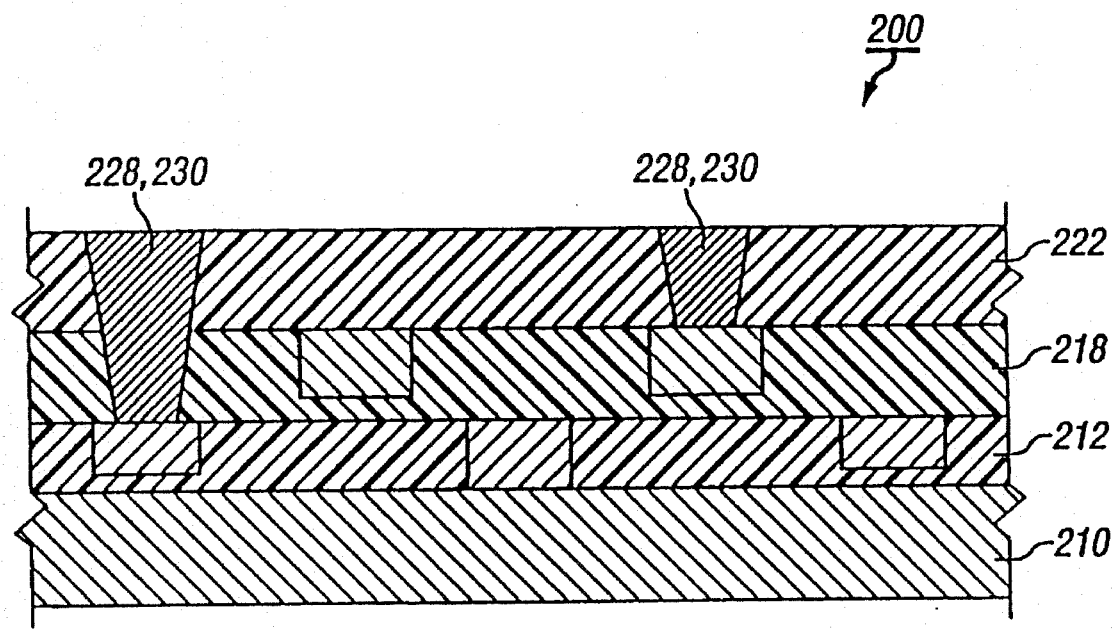
FIG. 2D is a cross-section of the semiconductor device of either FIG. 2B or FIG. 2C, after planarization by polishing of the excess via-filling metal.

As is shown in FIG. 2D, the excess metal (228, 230) has been removed, and (in the case of the under-filled via 216 in FIG. 2B) the second insulating layer 222 has been thinned, by chemi-mechanical polishing, resulting in vias 216 and 218 that are completely filled flush with the top surface of the second insulating layer 222.

PUSHED-UP METAL IN CONJUNCTION WITH VIA FILLING

Figure 3:
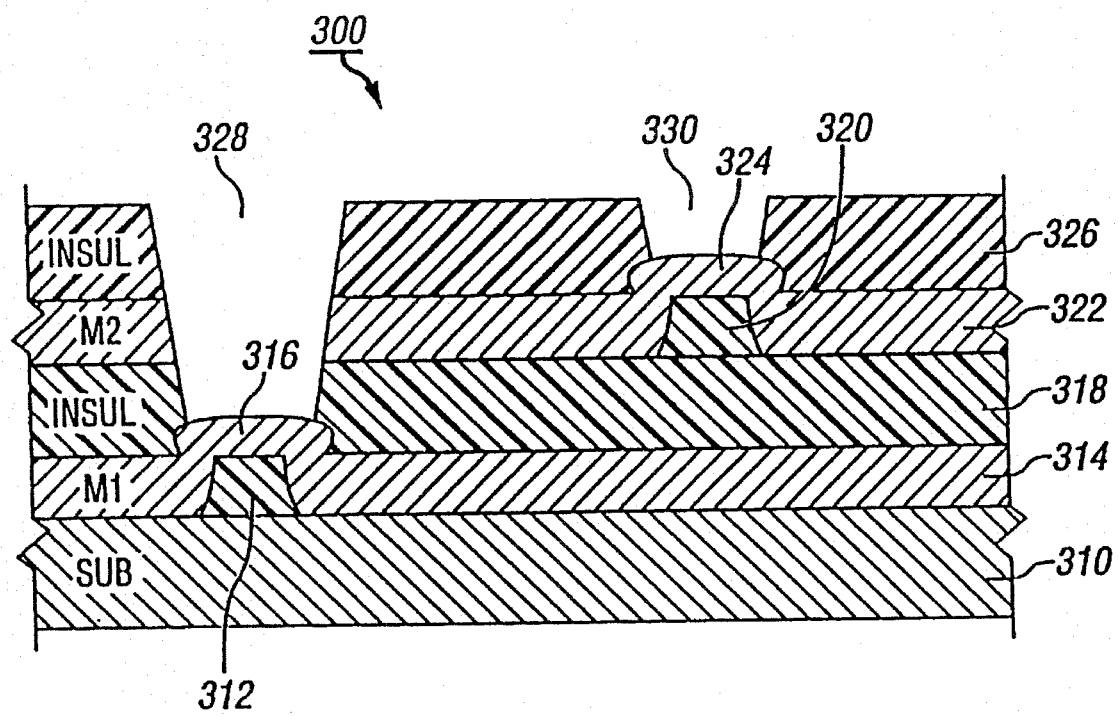
FIG. 3 is a cross-section of a semiconductor device employing the via formation and filling techniques illustrated in FIG. 1 and FIGS. 2A–2D.

FIG. 3 shows a semiconductor device 300, benefiting from a combination of the above-described techniques of pushed-up metal underlying vias (FIG. 1) and flush via-filling (FIGS. 2A–2D).

A substrate 310 has a generally planar top surface topography. Various insulating, stress relief and adhesion layers, and the like are omitted for descriptive clarity.

A pillar 312 is formed on the substrate (similar to the pillar 20a of FIG. 1). A first structure-containing layer 314 is then deposited. In this example, the layer 314 is a first metal (M1) layer, and contains a structure 316 in the form of a contact atop the pillar 312.

An insulating layer 318 is applied over the first metal layer 314, in the manner discussed hereinbefore with respect to FIG. 1.

Another pillar 320 is formed on the insulating layer 318, to push up a subsequent structure (feature), in the manner discussed hereinbefore with respect to FIG. 1.

A second structure-containing layer 322, such as a second metal (M2) layer is deposited, and includes a structure 324 in the form of a contact atop the pillar 320.

A subsequent insulating layer 326 is formed above the second structure-containing layer 322.

Evidently, the features (structures) 316 and 324 reside in different layers, and hence at different levels above the substrate 310.

A via 328 is formed through the insulating layer 326 and through the insulating layer 318, for inter-connecting to the structure (contact) 316. Another via 330 is formed through only the topmost insulating layer 326 for inter-connecting to the structure (contact) 324. The vias 328 and 330 may be filled and planarized (not shown) as discussed with respect to FIGS. 2A–2D.

In this manner, semiconductor devices benefiting from the teachings contained herein directed to pushing up features requiring subsequent inter-connect, and filling via holes from a top surface to different underlying layers work together cooperatively to provide enhanced sidewall step coverage in vias.

What is claimed is:

1. A semiconductor device, comprising:

a substrate having a non-planar surface;

a plurality of first insulated pillars formed on portions of the substrate surface;

a plurality of second insulated pillars formed on other portions of the substrate surface;

the plurality of first insulated pillars having a first height;

the plurality of second insulated pillars having a second height;

a first metalization layer deposited over the substrate non-planar surface, the plurality of first insulated pillars and the plurality of second insulated pillars, wherein the plurality of first and second insulated pillars push up portions of the metalization layer to a third height;

a first insulation layer deposited over the first metalization layer and planarized; and a plurality of first vias formed in the first insulation layer over the locations of the plurality of first and second insulated pillars, wherein the first vias extend through the planarized first insulating layer to the first metalization layer at the third height and have substantially the same depths.

2. The semiconductor device according to claim 1, further comprising a second metalization layer deposited over the planarized first insulation layer and into the first vias so as to connect to the pushed up portions of the first metalization layer.

3. The semiconductor device according to claim 1, further comprising:

a plurality of third insulated pillars formed on portions of the planarized first insulating layer;

a second metalization layer deposited over the planarized first insulating layer and plurality of third insulated pillars, wherein the plurality of third insulating pillars push up the second metalization layer;

a second insulation layer deposited over the second metalization layer and planarized; and a plurality of second vias formed in the second insulation layer over the locations of the plurality of third insulated pillars, wherein the plurality of second vias extend through the planarized second insulation layer to the second metalization layer and have substantially the same depths.

4. The semiconductor device according to claim 3, further comprising a third metalization layer deposited over the planarized second insulation layer and into the second vias so as to connect to the portions of the second metalization layer deposited over the third pillars.

\* \* \* \* \*